United States Patent
Liang et al.

(10) Patent No.: US 11,183,657 B2
(45) Date of Patent: Nov. 23, 2021

(54) QUANTUM DOT LIGHT EMITTING DIODE AND PREPARATION METHOD THEREOF

(71) Applicant: TCL TECHNOLOGY GROUP CORPORATION, Huizhou (CN)

(72) Inventors: Zhurong Liang, Huizhou (CN); Weiran Cao, Huizhou (CN); Jia Liu, Huizhou (CN)

(73) Assignee: TCL Technology Group Corporation, Huizhou (CN)

( * ) Notice: Subject to any disclaimer, the term of this patent is extended or adjusted under 35 U.S.C. 154(b) by 0 days.

(21) Appl. No.: 16/619,908

(22) PCT Filed: Mar. 20, 2018

(86) PCT No.: PCT/CN2018/079607
§ 371 (c)(1),
(2) Date: Dec. 5, 2019

(87) PCT Pub. No.: WO2019/024513
PCT Pub. Date: Feb. 7, 2019

(65) Prior Publication Data
US 2020/0373512 A1   Nov. 26, 2020

(30) Foreign Application Priority Data
Jul. 31, 2017   (CN) .................. 201710641801.X

(51) Int. Cl.
*H01L 29/06* (2006.01)
*H01L 51/50* (2006.01)
*H01L 51/56* (2006.01)

(52) U.S. Cl.
CPC ........ *H01L 51/5088* (2013.01); *H01L 51/502* (2013.01); *H01L 51/56* (2013.01); *H01L 2251/558* (2013.01)

(58) Field of Classification Search
CPC ... H01L 51/56; H01L 51/502; H01L 51/0096; H01L 27/307
See application file for complete search history.

(56) References Cited

U.S. PATENT DOCUMENTS

2008/0216894 A1* 9/2008 Hammond .............. H01L 31/04
                                                           136/263
2013/0193416 A1* 8/2013 Shin ........................ H01L 51/50
                                                           257/40
(Continued)

FOREIGN PATENT DOCUMENTS

CN   102403430 A   4/2012
CN   103682152 A   3/2014
(Continued)

*Primary Examiner* — Phuc T Dang
(74) *Attorney, Agent, or Firm* — Robert L. Stearns; Dickinson Wright, PLLC

(57) ABSTRACT

The present application provides a Quantum Dot Light Emitting Diode (QDLED), comprising an anode, a p-type graphene layer, a hole injection layer, a quantum dot light-emitting layer and a cathode, the anode and the cathode is oppositely disposed, the quantum dot light-emitting layer is disposed between the anode and the cathode, the p-type graphene layer is disposed between the anode and the quantum dot light-emitting layer, and the hole transport layer is disposed between the p-type graphene layer and the quantum dot light-emitting layer, wherein the p-type graphene layer is made from p-type doped graphene, and the p-type doped graphene is at least one selected from a doped graphene via adsorption and a doped graphene via lattice.

18 Claims, 1 Drawing Sheet

(56) References Cited

U.S. PATENT DOCUMENTS

| | | | | |
|---|---|---|---|---|
| 2014/0008634 A1* | 1/2014 | Matsuura | ............. | H01L 27/307 |
| | | | | 257/40 |
| 2015/0030968 A1* | 1/2015 | Schwab | ................ | C01B 32/192 |
| | | | | 429/532 |
| 2016/0233447 A1* | 8/2016 | Kim | ................... | H01L 51/0094 |
| 2017/0221969 A1* | 8/2017 | Steckel | .............. | H01L 27/3211 |
| 2018/0097066 A1* | 4/2018 | Lai | .................... | H01L 29/66037 |

FOREIGN PATENT DOCUMENTS

| | | |
|---|---|---|
| CN | 105489660 A | 4/2016 |
| CN | 106784212 A | 5/2017 |
| CN | 106941019 A | 7/2017 |
| CN | 107204401 A | 9/2017 |

* cited by examiner

QUANTUM DOT LIGHT EMITTING DIODE AND PREPARATION METHOD THEREOF

CROSS-REFERENCE TO RELATED APPLICATION

The present application is a 35 U.S.C. § 371 national stage application of PCT Application Ser. No. PCT/CN2018/079607, filed on Mar. 20, 2018, which claims priority to Chinese patent application No. CN201710641801.X, filed on Jul. 31, 2017, the entire contents of which are incorporated herein by reference in their entireties.

TECHNICAL FIELD

The present application relates to the field of Quantum Dot Light Emitting Diodes, and in particular to a Quantum Dot Light Emitting Diode and a preparation method thereof.

BACKGROUND

Quantum Dot Light Emitting Diode (QDLED), with the advantages of self-luminescence, high color purity, low energy consumption, stable image, wide viewing angle range and rich colors, is considered as a new generation of display technology after LCD and OLED, and has broad application prospects.

In QDLEDs, the imbalance of carriers (electrons and holes) injection is a key factor affecting the luminous efficiency and lifetime of devices. Specifically, since the transport speed of electrons is usually faster, and the injection and transport of holes are relatively difficult, an excessive amount of electrons accumulate in the quantum dot light-emitting layer, which makes quantum dots charged, so that excitons are prone to generate Auger Recombination and cause luminescence quenching, greatly affecting the luminous efficiency of QDLEDs. In addition, a large number of hole defect states on the surface of quantum dots, as well as the easily aggregated property of quantum dots, is prone to cause concentration quenching, which seriously affects the performance of QDLEDs. In order to improve the injection and transmission performance of the holes, most QDLEDs use poly(3,4-ethylenedioxythiophene)-polystyrene sulfonic acid (PEDOT:PSS) as a hole injection layer, which makes the hole inject smoothly from ITO anode to the quantum dot light-emitting layer. However, PEDOT:PSS has strong water adsorption and extremely strong acidity (pH 2-3), it is easy to corrode ITO and change the material properties of the hole transport layer, which seriously affects the stability of QDLEDs. Although inorganic p-type metal oxides (such as NiOx, MoOx, WOx, VOx, NiLiMgO, etc.) have been reported as hole injection/transport layer materials of QDLEDs, the injection and transport properties of holes of these metal oxides are not as good as PEDOT:PSS material, the performance stability of the device is poor, and the repeatability of the device is not good.

Technical Problems

The object of the present application is to provide a QDLED and a preparation method thereof, aiming at solving the problems of low luminous efficiency and poor performance stability of QDLEDs, in particular, solving the problem that PEDOT:PSS corrodes anodes and seriously affects the stability of QDLEDs, when PEDOT:PSS is provided as the hole injection layer of QDLEDs.

TECHNICAL SOLUTIONS

The present application is realized in this way, a Quantum Dot Light Emitting Diode (QDLED), comprising an anode, a p-type graphene layer, a hole injection layer, a quantum dot light-emitting layer and a cathode, wherein the anode and the cathode are oppositely disposed, the quantum dot light-emitting layer is disposed between the anode and the cathode, the p-type graphene layer is disposed between the anode and the quantum dot light-emitting layer, and the hole transport layer is disposed between the p-type graphene layer and the quantum dot light-emitting layer, wherein the p-type graphene layer is made from p-type doped graphene, and the p-type doped graphene is at least one selected from a doped graphene via adsorption and a doped graphene via lattice. For example, the p-type doped graphene may be a doped graphene via adsorption or a doped graphene via lattice, or the both.

And a method for preparing a Quantum Dot Light Emitting Diode (QDLED), comprising the following steps:

providing an anode substrate, and depositing a p-type graphene layer on the anode substrate;

depositing a hole injection layer on the p-type graphene layer, depositing a quantum dot light-emitting layer on the hole injection layer, and preparing a cathode on the quantum dot light-emitting layer so as to obtain a QDLED; or providing a cathode substrate, depositing a quantum dot light-emitting layer on the cathode substrate, and depositing a hole injection layer on the quantum dot light-emitting layer;

depositing a p-type graphene layer on the hole injection layer, and preparing an anode on the p-type graphene layer so as to obtain a QDLED.

BENEFICIAL EFFECTS

In the QDLED provided by the present application, a p-type graphene layer is provided between the anode and the hole injection layer. The p-type graphene layer is made from p-type doped graphene via adsorption and/or lattice doping, which can effectively reduce the hole injection barrier, improve the injection and transport efficiency of holes inside the QDLED, and further increase the luminous efficiency of the QDLED. At the same time, the introduction of the p-type graphene layer can effectively prevent the corrosion effect of the hole injection material, especially the weak acidic PEDOT:PSS, on the anode, and improve the stability of the QDLED. In particular, the QDLED can be applied not only to a conventional rigid QDLED, but also to a flexible QDLED.

The method for preparing a QDLED provided by the present application only needs to deposit a p-type graphene layer on an anode substrate on the basis of a conventional process, the method is simple and easy to control, and the obtained QDLED has improved luminous efficiency and stability.

EMBODIMENTS OF THE INVENTION

In order to make the technical problems to be solved, technical solutions and beneficial effects of the present application more clear, the present application will be further described in detail below with reference to the embodiments. It should be understood that the specific embodiments described herein are merely used to explain the present application and not intended to limit the present application.

Figure 1:
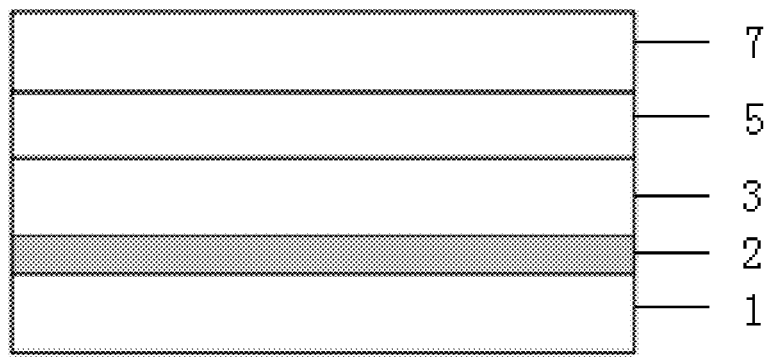
FIG. 1 is a schematic view showing the structure of a QDLED without a hole transport layer and an electron transport layer according to an embodiment of the present application.
Figure 2:
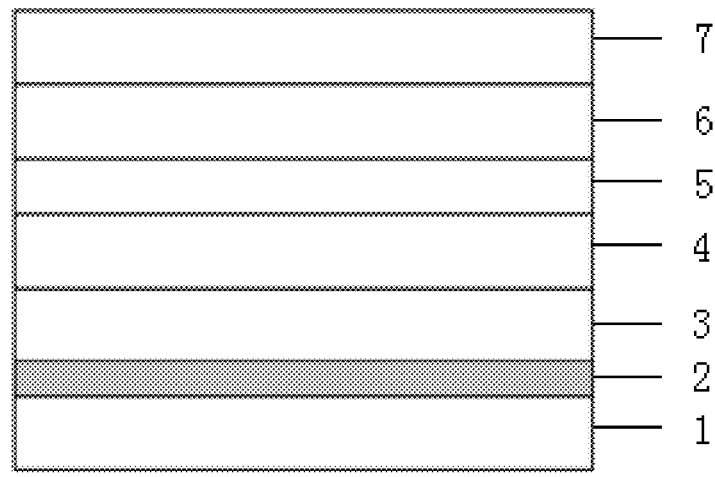
FIG. 2 is a schematic view showing the structure of a QDLED including a hole transport layer and an electron transport layer according to an embodiment of the present application.

Referring to FIGS. 1-2, an embodiment of the present application provides a QDLED, including an anode 1, a p-type graphene layer 2, a hole injection layer 3, a quantum dot light-emitting layer 5, and a cathode 7, wherein the anode 1 and the cathode 7 are oppositely disposed, the quantum dot light-emitting layer 5 is disposed between the anode 1 and the cathode 7, the p-type graphene layer 2 is disposed between the anode 1 and the quantum dot light-emitting layer 5, and the hole injection layer 3 is disposed between the p-type graphene 2 layer and the quantum dot light-emitting layer 5, wherein the p-type graphene layer 2 is made from p-type doped graphene, and the p-type doped graphene is at least one selected from a doped graphene via adsorption and a doped graphene via lattice. For example, the p-type doped graphene may be a doped graphene via adsorption or a doped graphene via lattice, or the both.

According to an embodiment of the present application, by introducing a p-type graphene layer 2 via adsorption and/or lattice doping between the anode 1 and the hole injection layer 3, the hole injection barrier is reduced, the hole injection efficiency is improved, thereby further balancing the carrier injection balance and improving the luminous efficiency of the device. At the same time, the p-type graphene layer 2 via adsorption and/or lattice doping can resist corrosion and water-oxygen permeation, thereby effectively preventing the corrosion effect of the hole injection material, especially the weak acidic PEDOT:PSS, on the anode 1, and improving the stability of the QDLED.

According to an embodiment of the present application, since graphene is a two-dimensional structural material having large specific surface area, the surface thereof can adsorb some small molecules, wherein molecules having strong electron adsorption ability have significant doping effect on grapheme, and thus convert grapheme to p-type graphene. Specifically, the doped graphene via adsorption can be at least one selected from a nitrogen-doped graphene, a nitrogen-dioxide-doped graphene, a water-molecule-doped graphene, a fluoropolymer-doped graphene, and a metal-doped graphene. In other words, the doped graphene via adsorption may include any one, two, three or four doped graphenes selected from a nitrogen-doped graphene, a nitrogen-dioxide-doped graphene, a water-molecule-doped graphene, a fluoropolymer-doped graphene, and a metal-doped graphene, or all of them, for example, nitrogen-doped graphene; nitrogen-doped graphene and nitrogen-dioxide-doped graphene; water-molecule-doped graphene, fluoropolymer-doped graphene and metal-doped graphene; nitrogen-doped graphene, nitrogen-dioxide-doped graphene, water-molecule-doped graphene and fluoropolymer-doped graphene; nitrogen-doped graphene, nitrogen-dioxide-doped graphene, water-molecule-doped graphene, fluoropolymer-doped graphene and metal-doped graphene; ect. The doping of the above dopants (nitrogen, nitrogen dioxide, water molecule, fluoropolymer, metal) according to an embodiment of the present application can realize the conversion of graphene to p-type graphene. Wherein, in the water-molecule-doped grapheme, the water molecule can be adsorbed on the graphene by its dipole moment, and then a local electrostatic field is generated, which causes the charge in the graphene to partially transfer to the water molecule, resulting in p-type doping, and the higher the amount of water molecule adsorbed, the wider the band gap of p-type graphene. In the nitrogen-dioxide-doped graphene, the nitrogen dioxide adsorbs electrons in the grapheme due to the strong oxidation of nitrogen dioxide, thus the graphene presents p-type. In the metal-doped graphene, when the metal is in contact with the graphene, charge transfer occurs due to the difference of work functions of the two, thus the graphene presents p-type.

According to an embodiment of the present application, the p-type graphene can be obtained by lattice doping of graphene. Specifically, in the preparation of graphene, by introducing different doping atomic sources, some carbon atoms in the lattice structure of graphene can be replaced by other atoms, thereby forming lattice doping. More specifically, the doped graphene via lattice can be at least one selected from a halogen-atom-doped graphene, a boron-atom-doped graphene, and an oxygen-atom-doped graphene. In other words, the doped graphene via lattice may include both any one or two doped graphenes selected from a halogen-atom-doped graphene, a boron-atom-doped graphene, and an oxygen-atom-doped graphene, or all of them, for example, halogen-atom-doped graphene; halogen-atom-doped graphene and boron-atom-doped graphene; halogen-atom-doped graphene, boron-atom-doped graphene and oxygen-atom-doped graphene; etc.

Of course, it should be understood that the doping form of the p-type graphene layer 2 is not strictly limited to one of a doped graphene via adsorption and a doped graphene via lattice, and can simultaneously contain the doped graphene via adsorption and the doped graphene via lattice, that is, the p-type doped graphene can be a compound p-type doped graphene formed by at least one of a nitrogen-doped graphene, a nitrogen-dioxide-doped graphene, a water-molecule-doped graphene, a fluoropolymer-doped graphene, and a metal-doped grapheme, together with at least one of a halogen-atom-doped graphene, a boron-atom-doped graphene, and an oxygen-atom-doped graphene. In other words, the compound p-type doped graphene may include both one or more doped graphenes selected from a nitrogen-doped graphene, a nitrogen-dioxide-doped graphene, a water-molecule-doped graphene, a fluoropolymer-doped graphene, and a metal-doped graphene and one or more doped graphenes selected from a halogen-atom-doped graphene, a boron-atom-doped graphene, and an oxygen-atom-doped graphene. According to an embodiment of the present application, the fluoropolymer-doped graphene can be selected from perfluoro(1-butenyl vinyl ether) polymer (CYTOP). According to an embodiment of the present application, in the metal-doped graphene, the doping metal is at least one selected from Pt, Au, Ag, Au, Al, Bi, and Sb. In other words, the doping metal may include one or more doping metals selected from Pt, Au, Ag, Au, Al, Bi, and Sb, for example, Au; Pt and Al; Au, Ag and Sb; Pt, Au, Al, and Bi; Pt, Au, Ag, Au, Al and Bi; Pt, Au, Ag, Au, Al, Bi, and Sb; etc. When the above-said doping metal is in contact with graphene, charge transfer occurs due to the difference of work function of the two (electrons are transferred from the material of low work function to the material of high work function). Specifically, the work function of graphene is about 4.5 eV, therefore, when a metal of high work function is in contact with graphene, the metal will p-type doping the graphene.

Further, according to an embodiment of the present application, in the p-type doped graphene, the doping percentage content of the dopant is 0.001-2%. Since the band gap width of graphene changes after being doped, with different dopants, the changes of band gap are also different. The doping ratio of the embodiment of the present application in the above-said range can generally reduce the hole injection barrier more effectively, improve the injection and transport efficiency of the hole inside the QDLED, and further improve the luminous efficiency of the QDLED. In order to simultaneously impart better luminous efficiency and stability to the QDLED, according to an embodiment of the invention, the p-type graphene layer 2 has a thickness of 1-80 nm. If the thickness of the p-type graphene layer 2 is too thin, the hole injection barrier cannot be effectively reduced, and the improvement of the luminous efficiency of the device is limited, and at the same time, since the film layer is too thin, the protection effect on the anode 1 is relatively weak. If the thickness of the p-type graphene layer 2 is too thick, exciton recombination is difficult, and on the contrary, the luminous efficiency of the QDLED is reduced.

As an embodiment, as shown in FIG. 2, the QDLED comprises an anode 1, a p-type graphene layer 2, a hole injection layer 3, a hole transport layer 4, a quantum dot light-emitting layer 5, an electron transport layer 6, and a cathode 7, wherein the anode 1 and the cathode 7 are oppositely disposed, the quantum dot light-emitting layer 5 is disposed between the anode 1 and the cathode 7, the p-type graphene layer 2 is disposed between the anode 1 and the quantum dot light-emitting layer 5, the hole injection layer 3 is disposed between the p-type graphene layer 2 and the quantum dot light-emitting layer 5, the hole transport layer 4 is disposed between the hole injection layer 3 and the quantum dot light-emitting layer 5, and the electron transport layer 6 is disposed between the cathode 7 and the quantum dot light-emitting layer 5, wherein the p-type graphene layer 2 is made from p-type doped graphene, and the p-type doped graphene is at least one selected from a doped graphene via adsorption and a doped graphene via lattice. For example, the p-type doped graphene may be a doped graphene via adsorption or a doped graphene via lattice, or the both.

In the above-said embodiment, specifically, the anode 1 can select a conventional anode material in QDLED field, including but not limited to indium-doped tin oxide (ITO).

The hole injection layer 3 can select a conventional hole injection material, when PEDOT:PSS is selected, the corrosion effect on the anode can be effectively improved, and the performance of QDLED is remarkably improved.

The hole transport layer 4 may be made from an organic material having a hole transport ability. Specifically, the organic hole transport material includes, but is not limited to, at least one of poly(9,9-dioctylfluorene-CO—N-(4-butylphenyl)diphenylamine) (TFB), polyvinylcarbazole (PVK), poly(N,N'bis(4-butylphenyl)-N,N'-bis(phenyl)benzidine) (poly-TPD), poly(9,9-dioctylfluorene-co-bis-N,N-phenyl-1,4-phenylenediamine) (PFB), 4,4',4"-tris(carbazol-9-yl)triphenylamine (TCTA), 4,4'-di(9-carbazole)biphenyl (CBP), N,N'-diphenyl-N,N'-bis(3-methylphenyl)-1,1'-biphenyl-4,4'-diamine (TPD), N,N'-diphenyl-N,N'-(1-naphthyl)-1,1'-biphenyl-4,4'-diamine (NPB), doped graphene, undoped graphene and C60. In other words, the organic hole transport material may include one or more materials selected from poly(9,9-dioctylfluorene-CO—N-(4-butylphenyl)diphenylamine) (TFB), polyvinylcarbazole (PVK), poly(N,N'bis(4-butylphenyl)-N,N'-bis(phenyl)benzidine) (poly-TPD), poly(9,9-dioctylfluorene-co-bis-N,N-phenyl-1,4-phenylenediamine) (PFB), 4,4',4"-tris(carbazol-9-yl)triphenylamine (TCTA), 4,4'-di(9-carbazole)biphenyl (CBP), N,N'-diphenyl-N,N'-bis(3-methylphenyl)-1,1'-biphenyl-4,4'-diamine (TPD), N,N'-diphenyl-N,N'-(1-naphthyl)-1,1'-biphenyl-4,4'-diamine (NPB), doped graphene, undoped graphene and C60, for example, poly(9,9-dioctylfluorene-CO—N-(4-butylphenyl)diphenylamine) (TFB); poly(N,N'bis(4-butylphenyl)-N,N'-bis(phenyl)benzidine) (poly-TPD), poly(9,9-dioctylfluorene-co-bis-N,N-phenyl-1,4-phenylenediamine) (PFB) and 4,4',4"-tris(carbazol-9-yl)triphenylamine (TCTA); etc. The hole transport layer 4 can also be made from inorganic material having a hole transport ability. Specifically, the inorganic hole transport material includes, but is not limited to, at least one of doped or undoped $MoO_x$, $VO_x$, $WO_x$, $CrO_x$, $CuO$, $MoS_2$, $MoSe_2$, $WS_2$, $WSe_2$, and $CuS$, In other words, the inorganic hole transport material may include one or more doped/undoped materials selected from $MoO_x$, $VO_x$, $WO_x$, $CrO_x$, $CuO$, $MoS_2$, $MoSe_2$, $WS_2$, $WSe_2$, and $CuS$, for example, doped $MoO_x$; undoped $CuO$; doped $WO_x$ and doped $CrO_x$; doped $MoS_2$, undoped $WS_2$ and undoped $CuS$; etc.

The quantum dot light-emitting layer 5 is made from conventional quantum dot, and said quantum dot can be one or more of group II-VI nanocrystal, group III-V nanocrystal, group II-V nanocrystal, group III-VI nanocrystal, and group IV-VI nanocrystal, group I-III-VI nanocrystal, group II-IV-VI nanocrystal and group IV element. Specifically, the group II-VI nanocrystal includes, but is not limited to, CdS, CdSe, CdTe, ZnS, ZnSe, ZnTe, HgS, HgSe, HgTe, PbS, PbSe and PbTe, and can be other binary, ternary or quaternary II-VI nanocrystals; the group III-V nanocrystal includes, but is not limited to, GaP, GaAs, InP and InAs, and can be other binary, ternary and quaternary III-V compounds.

As an embodiment, the quantum dot is doped or undoped inorganic perovskite semiconductor, and/or organic-inorganic hybrid perovskite semiconductor. Specifically, the inorganic perovskite semiconductor has a structural formula of $AMX_3$, wherein A represents $Cs^+$ cation, and M represents divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$ and $Eu^{2+}$, X represents halogen anion, including but not limited to $Cl^-$, $Br^-$ and $I^-$. The organic-inorganic hybrid perovskite semiconductor has a structural formula of $BMX_3$, wherein B represents organic amine cation, including but not limited to $CH_3(CH_2)_{n-2}NH_3^+$ (n≤2) or $NH_3(CH_2)_nNH_3^{2+}$ (N≤2). When n=2, the inorganic metal halide octahedron $MX_6^{4-}$ is joined by a common top, the metal cation M is located in the body center of the halogen octahedron, and the organic amine cation B is filled in the space between the octahedrons to form an infinitely extending three-dimensional structure; when n>2, the inorganic metal halide octahedron $MX_6^{4-}$ joined in a common top extends in a two-dimensional direction to form a layered structure, with the interlayer of organic amine cation bilayer (protonated monoamine) or organic amine cation monolayer (protonated bisamine) inserted, the organic layer and the inorganic layer overlap each other to form a stable two-dimensional layered structure; M represents divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$ and $Eu^{2+}$, X represents halogen anion, including but not limited to $Cl^-$, $Br^-$ and $I^-$.

The electron transport layer 6 is selected from materials having electron transport properties, such as metal oxides having electron transport properties, including but not limited to n-type ZnO, $TiO_2$, SnO, $Ta_2O_3$, AlZnO, ZnSnO, InSnO, $Alq_3$, Ca, Ba, CsF, LiF, and $CsCO_3$.

The cathode 7 is one or more of various conductive carbon material, conductive metal oxide material and metal material. The conductive carbon material includes, but is not limited to, doped or undoped carbon nanotube, doped or undoped graphene, doped or undoped graphene oxide, C60, graphite, carbon fiber, porous carbon, or mixture thereof; the conductive metal oxide material includes, but is not limited to, ITO, FTO, ATO, AZO, or mixture thereof; the metal material includes, but is not limited to, Al, Ag, Cu, Mo, Au, or alloy thereof. Wherein, the shape of the metal material includes, but not limited to, nanosphere, nanowire, nanorod, nanocone, hollow nanosphere, or mixture. According to an embodiment of the present application, the cathode 7 is Ag or Al.

Further, the QDLED according to embodiments of the present application further includes an interface modification layer, wherein the interface modification layer is at least one of an electron blocking layer, a hole blocking layer, an electron injection layer, an electrode modification layer, and an isolation protection layer.

The QDLED according to embodiments of the present application may further include an electron injection layer deposited between the electron transport layer and the cathode. Further, the QDLED according to embodiments of the present application further includes an interface modification layer, wherein the interface modification layer is at least one of an electron blocking layer, a hole blocking layer, an electrode modification layer, and an isolation protection layer. More specifically, the QDLED usually comprises an anode, a hole injection layer, a hole transport layer, a light-emitting layer, an electron transport layer, an electron injection layer, and a cathode, and the interface modification layer may include one or more layers selected from an electron blocking layer, a hole blocking layer, an electrode modification layer, and an isolation protection layer. For example, when an electrode modification layer is included, it may be a anode modification layer deposited between the anode and the hole injection layer or a cathode modification layer deposited between the cathode and the electron injection layer; when an electron blocking layer is included, the electron blocking layer may be deposited between the electron transport layer and the light-emitting layer so as to slow down the transmission of electrons, or between the hole transport layer and the light-emitting layer so as to prevent excessive electrons in the light-emitting layer from transferring to the hole transport layer; when an hole blocking layer is included, the hole blocking layer may be deposited between the hole transport layer and the light-emitting layer so as to slow down the transmission of holes, or between the electron transport layer and the light-emitting layer so as to prevent excessive holes in the light-emitting layer from transferring to electron transport layer, and usually the electron blocking layer and the hole blocking layer may not be deposited both, the electron blocking layer may be deposited when the transmission speed of electrons is higher than the transmission speed of holes, so as to balance the electrons and holes in the light-emitting layer, and the hole blocking layer may be deposited when the transmission speed of electrons is lower than the transmission speed of holes; when an isolation protection layer is included, the isolation protection layer may be deposited on the top electrode for protecting the top electrode, wherein, the top electrode is the cathode in a positive-configuration, and the top electrode is the anode in an inverse-configuration.

Of course, the QDLED can be partial encapsulation device, full encapsulation device, or non-encapsulation device.

In the QDLED provided by the embodiment of the invention, a p-type graphene layer is disposed between the anode and the hole injection layer. The p-type graphene layer is made from p-type doped graphene via adsorption and/or lattice doping, which can effectively reduce the hole injection barrier, improve the injection and transport efficiency of holes in the QDLED, and further increase the luminous efficiency of the QDLED. At the same time, the introduction of the p-type graphene layer can effectively prevent the corrosion effect of the hole injection material, especially the weakly acidic PEDOT:PSS, on the anode, and improve the stability of the QDLED. In particular, the QDLED can be applied not only to a conventional rigid QDLED, but also to a flexible QDLED.

The embodiment of the invention further provides a method for preparing a QDLED, comprising the following steps:

S01. Providing an anode substrate, and depositing a p-type graphene layer on the anode substrate;

S02. Depositing a hole injection layer on the p-type graphene layer, depositing a quantum dot light-emitting layer on the hole injection layer, and preparing a cathode on the quantum dot light-emitting layer so as to obtain a QDLED; or Q01. Providing a cathode substrate, depositing a quantum dot light-emitting layer on the cathode substrate, and depositing a hole injection layer on the quantum dot light-emitting layer;

Q02. Depositing a p-type graphene layer on the hole injection layer, and preparing an anode on the p-type graphene layer so as to obtain a QDLED.

Specifically, in the above-said step S01 or the above-said step Q02, the methods for depositing a p-type graphene layer on the anode substrate or depositing a p-type graphene layer on the hole injection layer can be chemical methods or physical methods. Specifically, the chemical methods include one of chemical vapor deposition, successive ionic layer adsorption and reaction, anodization, electrolytic deposition, and co-precipitation; and the physical methods include physical coating methods and solution processing methods, wherein, the solution processing methods include spin coating, printing, blade coating, dip-coating, immersion, spraying, roll coating, casting, slit coating, and strip coating; the physical coating methods include one or more of thermal evaporation coating, electron beam evaporation coating, magnetron sputtering, multi-arc ion plating, physical vapor deposition, atomic layer deposition, and pulse laser deposition.

The material selection of each structural layer is as described above, and in order to save space, it will not be repeated herein. The deposition method of each layer can be a conventional method such as chemical method or physical method. The specific selection of the chemical method and the physical method is the same as the above step S01, and in order to save space, it will not be repeated herein. According to an embodiment of the present application, the hole injection layer and the quantum dot light-emitting layer are realized by adopting solution processing, and the cathode is realized by adopting thermal evaporation.

Further, an interface modification layer can be deposited in the QDLED, wherein the interface modification layer is at least one of an electron blocking layer, a hole blocking layer, an electrode modification layer, and an isolation protection layer. That is, the interface modification layer may include one or more layers selected from an electron blocking layer, a hole blocking layer, an electrode modification layer, and an isolation protection layer. The interface modification layer can be implemented by the deposition method of the hole injection layer.

The method for preparing the QDLED provided by the embodiment of the invention only needs to deposit a p-type graphene layer on the anode substrate on the basis of a conventional process, the method is simple and easy to control, and the luminous efficiency and stability of the obtained QDLED are improved.

The following description will be made with reference to specific embodiments.

Embodiment 1

A QDLED, comprising an ITO anode, a bromine-doped graphene layer, a PEDOT:PSS hole injection layer, a CdSe/ZnS quantum dot light-emitting layer and an Al cathode, being sequentially disposed.

A method for preparing the QDLED, comprising the following steps:

S11. Providing an ITO anode substrate, transferring a bromine-doped single-layer graphene layer on the anode substrate;

S12. Sequentially depositing a PEDOT:PSS hole injection layer, a CdSe/ZnS quantum dot light-emitting layer on the bromine-doped single-layer graphene layer, and finally evaporating an Al cathode so as to obtain a QDLED.

Embodiment 2

A QDLED, comprising an ITO anode, a bromine-doped graphene layer, a PEDOT:PSS hole injection layer, a TFB hole transport layer, a CdSe/ZnS quantum dot light-emitting layer, a ZnO electron transport layer and an Al cathode, being sequentially disposed.

A method for preparing the QDLED, comprising the following steps:

S21. Providing an ITO anode substrate, and transferring a bromine-doped single-layer graphene layer on the anode substrate;

S22. Sequentially depositing a PEDOT:PSS hole injection layer, a TFB hole transport layer, a CdSe/ZnS quantum dot light-emitting layer, and a ZnO electron transport layer on the bromine-doped single-layer graphene layer, and finally evaporating an Al cathode so as to obtain a QDLED.

The above is only the preferred embodiment of the present application, and is not intended to limit the present application. Any modifications, equivalent substitutions and improvements made within the spirit and principles of the present application should be included in the scope of protection of the present application.

What is claimed is:

1. A Quantum Dot Light Emitting Diode (QDLED), comprising an anode, a p-type graphene layer, a hole injection layer, a quantum dot light-emitting layer, and a cathode, wherein the anode and the cathode are oppositely disposed, the quantum dot light-emitting layer is disposed between the anode and the cathode, the p-type graphene layer is disposed between the anode and the quantum dot light-emitting layer, and the hole injection layer is disposed between the p-type graphene layer and the quantum dot light-emitting layer, wherein the p-type graphene layer is made from p-type doped graphene, and the p-type doped graphene is at least one selected from a doped graphene via adsorption and a doped graphene via lattice,
wherein the doped graphene via adsorption is at least one selected from a nitrogen-doped graphene, a nitrogen-dioxide-doped graphene, a water-molecule-doped graphene, a fluoropolymer-doped graphene, and a metal-doped graphene.

2. The QDLED according to claim 1, wherein the fluoropolymer-doped graphene is selected from perfluoro(1-butenyl vinyl ether) polymer.

3. The QDLED according to claim 1, wherein in the metal-doped graphene, the doping metal is at least one selected from Pt, Au, Ag, Au, Al, Bi, and Sb.

4. The QDLED according to claim 1, wherein the doped graphene via lattice is at least one selected from a halogen-atom-doped graphene, a boron-atom-doped graphene, and an oxygen-atom-doped graphene.

5. The QDLED according to claim 1, wherein the p-type doped graphene is a compound p-type doped graphene formed by at least one of a nitrogen-doped graphene, a nitrogen-dioxide-doped graphene, a water-molecule-doped graphene, a fluoropolymer-doped graphene, and a metal-doped grapheme, together with at least one of a halogen-atom-doped graphene, a boron-atom-doped graphene, and an oxygen-atom-doped graphene.

6. The QDLED according to claim 1, wherein in the p-type doped graphene, the doping percentage content of the dopant is 0.001-2%.

7. The QDLED according to claim 1, wherein the p-type graphene layer has a thickness of 1-80 nm.

8. The QDLED according to claim 1, further comprising an interface modification layer, wherein the interface modification layer is at least one of a hole transport layer, an electron blocking layer, an electron transport layer, and a hole blocking layer.

9. The QDLED of claim 1, wherein the QDLED is a partial encapsulation device, a fully encapsulation device, or a non-encapsulation device.

10. A method for preparing a Quantum Dot Light Emitting Diode (QDLED), comprising the steps of:
providing an anode substrate and depositing a p-type graphene layer on the anode substrate; and depositing a hole injection layer on the p-type graphene layer, depositing a quantum dot light-emitting layer on the hole injection layer, and preparing a cathode on the quantum dot light-emitting layer so as to obtain a QDLED;
or
providing a cathode substrate, depositing a quantum dot light-emitting layer on the cathode substrate, and depositing a hole injection layer on the quantum dot light-emitting layer; and depositing a p-type graphene layer on the hole injection layer, and preparing an anode on the p-type graphene layer so as to obtain a QDLED;
wherein
the method further comprising depositing an interface modification layer; and
the interface modification layer is at least one of a hole transport layer, an electron blocking layer, an electron transport layer, a hole blocking layer.

11. The method according to claim 10, wherein the methods for depositing the p-type graphene layer on the anode substrate are chemical methods or physical methods.

12. The method according to claim 11, wherein the chemical methods include one of chemical vapor deposition, successive ionic layer adsorption and reaction, anodization, electrolytic deposition, and co-precipitation; the physical methods include physical coating methods and solution processing methods, wherein the solution processing methods include spin coating, printing, blade coating, dip-coating, immersion, spraying, roll coating, casting, slit coating, and strip coating; and the physical coating methods include one or more of thermal evaporation coating, electron beam evaporation coating, magnetron sputtering, multi-arc ion plating, physical vapor deposition, atomic layer deposition, and pulse laser deposition.

13. The method according to claim 10, wherein the p-type doped graphene is at least one selected from a doped graphene via adsorption and a doped graphene via lattice.

14. The method according to claim 13, wherein the doped graphene via lattice is at least one selected from a halogen-atom-doped graphene, a boron-atom-doped graphene, and an oxygen-atom-doped graphite.

15. The method according to claim 13, wherein the doped graphene via adsorption is at least one selected from a nitrogen-doped graphene, a nitrogen-dioxide-doped graphene, a water-molecule-doped grapheme, a fluoropolymer-doped graphene and a metal-doped graphene.

16. The method according to claim 15, wherein the fluoropolymer-doped graphene is selected from perfluoro(1-butenyl vinyl ether) polymer.

17. The method according to claim 15, wherein in the metal-doped graphene, the doping metal is at least one selected from Pt, Au, Ag, Au, Al, Bi, and Sb.

18. A QDLED, comprising an anode, a p-type graphene layer, a hole injection layer, a quantum dot light-emitting layer, and a cathode, wherein the anode and the cathode are oppositely disposed, the quantum dot light-emitting layer is disposed between the anode and the cathode, the p-type graphene layer is disposed between the anode and the quantum dot light-emitting layer, and the hole injection layer is disposed between the p-type graphene layer and the quantum dot light-emitting layer, wherein the p-type graphene layer is made from p-type doped graphene, and the p-type doped graphene is at least one selected from a doped graphene via adsorption and a doped graphene via lattice, wherein the p-type doped graphene is a compound p-type doped graphene formed by at least one of a nitrogen-doped graphene, a nitrogen-dioxide-doped graphene, a water-molecule-doped graphene, a fluoropolymer-doped graphene, and a metal-doped grapheme, together with at least one of a halogen-atom-doped graphene, a boron-atom-doped graphene, and an oxygen-atom-doped grapheme.

* * * * *